(12) United States Patent
Ihara et al.

(10) Patent No.: US 9,451,704 B2
(45) Date of Patent: Sep. 20, 2016

(54) SUSPENSION BOARD ASSEMBLY SHEET WITH CIRCUITS AND METHOD FOR MANUFACTURING THE SAME

(71) Applicant: Nitto Denko Corporation, Ibaraki-shi, Osaka (JP)

(72) Inventors: Terukazu Ihara, Ibaraki (JP); Jun Ishii, Ibaraki (JP); Naohiro Terada, Ibaraki (JP)

(73) Assignee: NITTO DENKO CORPORATION, Ibaraki-Shi, Osaka (JP)

( * ) Notice: Subject to any disclaimer, the term of this patent is extended or adjusted under 35 U.S.C. 154(b) by 308 days.

(21) Appl. No.: 14/062,264

(22) Filed: Oct. 24, 2013

(65) Prior Publication Data

US 2014/0126169 A1 May 8, 2014

Related U.S. Application Data

(60) Provisional application No. 61/730,088, filed on Nov. 27, 2012.

(30) Foreign Application Priority Data

Nov. 8, 2012 (JP) .................................. 2012-245870

(51) Int. Cl.
*H05K 1/00* (2006.01)
*H05K 3/10* (2006.01)
(Continued)

(52) U.S. Cl.
CPC ................. *H05K 3/10* (2013.01); *G11B 5/486* (2013.01); *H05K 1/025* (2013.01); *H05K 3/0097* (2013.01);
(Continued)

(58) Field of Classification Search
CPC .... G11B 5/486; G11B 5/3166; H05K 1/056; H05K 1/00; H05K 1/0269; H05K 1/0268; H05K 1/14; H05K 3/0097; H05K 3/225; H05K 3/0052; H05K 3/0008; H05K 2201/09127
See application file for complete search history.

(56) References Cited

U.S. PATENT DOCUMENTS

2005/0282088 A1* 12/2005 Aonuma .................. H05K 3/44
430/311
2007/0170911 A1* 7/2007 Ohsawa ................. G11B 5/486
324/763.01
(Continued)

FOREIGN PATENT DOCUMENTS

| JP | 2010-135754 A | 6/2010 |
| JP | 2012-018984 A | 1/2012 |
| JP | 2012-134197 A | 7/2012 |

OTHER PUBLICATIONS

Office Action issued May 24, 2016 in JP Application No. 2012-245870.

*Primary Examiner* — Steven T Sawyer
(74) *Attorney, Agent, or Firm* — Panitch Schwarze Belisario & Nadel LLP

(57) ABSTRACT

A plurality of suspension boards and an inspection substrate are integrally supported by a support frame. In each suspension board, a line is formed on a conductive first support substrate via a first insulating layer. The first support substrate and the line are electrically connected by a first via in the first insulating layer. In the inspection substrate, a conductor layer is formed on a conductive second support substrate with a second insulating layer sandwiched therebetween. The second support substrate and the conductor layer are electrically connected by a second via in the second insulating layer. The first via and the second via have the same configuration.

7 Claims, 14 Drawing Sheets

(51) Int. Cl.
*G11B 5/48* (2006.01)
*H05K 3/00* (2006.01)
*H05K 3/46* (2006.01)
*H05K 1/02* (2006.01)
*H05K 1/05* (2006.01)
*H05K 3/06* (2006.01)

(52) U.S. Cl.
CPC ........... *H05K 3/4685* (2013.01); *H05K 1/0228* (2013.01); *H05K 1/0245* (2013.01); *H05K 1/0265* (2013.01); *H05K 1/056* (2013.01); *H05K 3/06* (2013.01); *H05K 2201/0979* (2013.01); *H05K 2201/09236* (2013.01); *H05K 2201/09254* (2013.01); *H05K 2201/09509* (2013.01); *H05K 2201/09554* (2013.01); *H05K 2201/09627* (2013.01); *H05K 2203/0323* (2013.01); *Y10T 29/49155* (2015.01)

(56) References Cited

U.S. PATENT DOCUMENTS

| | | | |
|---|---|---|---|
| 2007/0241764 A1* | 10/2007 | Naito | H05K 1/0269 324/759.02 |
| 2009/0261060 A1* | 10/2009 | Mizushima | H05K 3/242 216/13 |
| 2010/0032201 A1* | 2/2010 | Ooyabu | G11B 5/484 174/262 |
| 2010/0047626 A1* | 2/2010 | Hitomi | G11B 5/486 428/810 |
| 2010/0116540 A1 | 5/2010 | Ishii et al. | |
| 2011/0058347 A1* | 3/2011 | Ihara | G11B 5/484 361/802 |
| 2012/0152592 A1 | 6/2012 | Ishii | |

* cited by examiner

F I G. 6
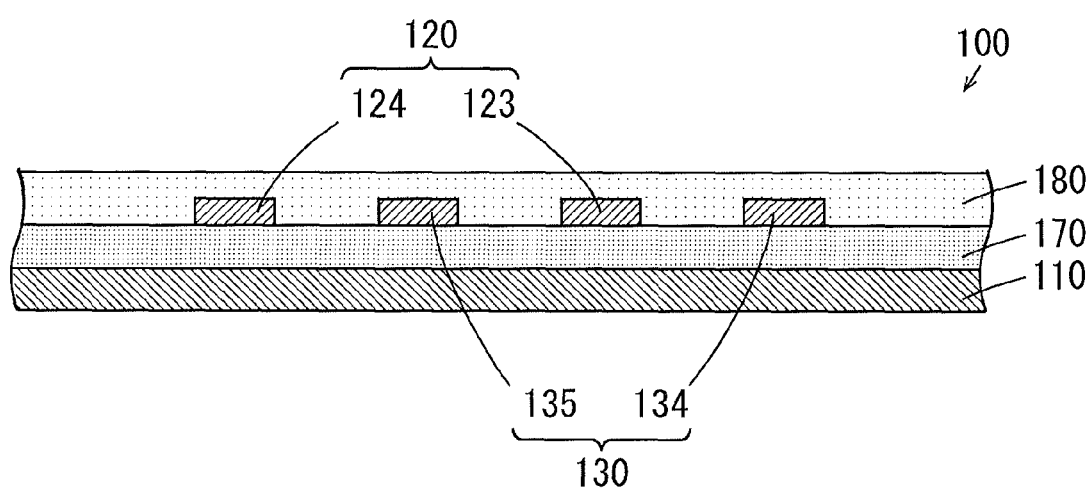

F I G. 1 4
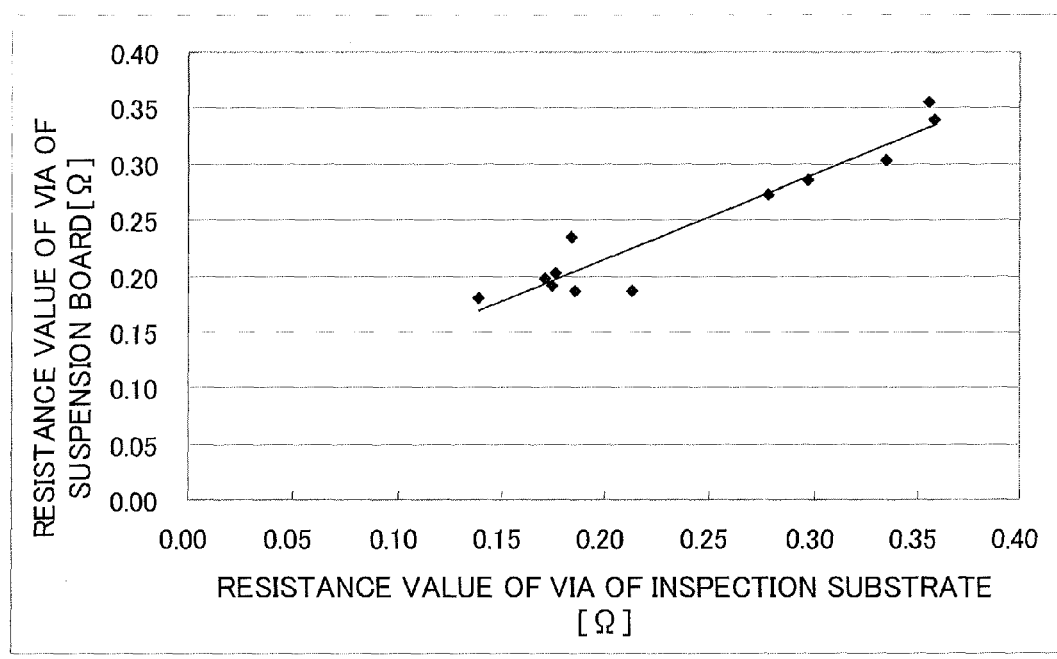

SUSPENSION BOARD ASSEMBLY SHEET WITH CIRCUITS AND METHOD FOR MANUFACTURING THE SAME

BACKGROUND OF THE INVENTION

1. Field of the Invention

The present invention is related to a suspension board assembly sheet with circuits and a method for manufacturing the suspension board assembly sheet with circuits.

2. Description of Related Art

Actuators are used in drives such as hard disk drives. Such an actuator includes an arm provided rotatably around a rotation shaft, and a suspension board with circuits (hereinafter referred to as a suspension board) for a magnetic head that is attached to the arm. The suspension board is a printed circuit board for positioning the magnetic head at a desired track of a magnetic disk.

The suspension board includes the magnetic head and is connected to another electronic circuit. A conductor pattern is formed at the suspension board, and an electric signal is transmitted between another electronic circuit and the magnetic head through the conductor pattern. The plurality of suspension boards having such configuration are formed to be integrally supported at a common support frame in the process of manufacturing (see JP 2012-18984 A, for example).

In each suspension board, a ground wiring layer and a signal wiring layer are formed on a metallic support substrate with an insulating layer sandwiched therebetween. The ground wiring layer and a metallic support substrate are electrically connected by a plated via portion that penetrates the insulating layer. Further, in the support frame, a conductor layer is formed on the metallic support substrate with the insulating layer sandwiched therebetween.

BRIEF SUMMARY OF THE INVENTION

In JP 2012-18984 A, a substrate for suspension with a support frame having an inspecting plated via portion (a plated via portion for inspection) at the support frame is described. According to JP 2012-18984 A, it is possible to perform inspection of a plated via portion of a plurality of suspension boards by performing inspection of the inspecting plated via portion at the support frame without directly respectively inspecting the plated via portions of the plurality of suspension boards. Thus, a time period for inspection of the plated via portions of the plurality of suspension boards is shortened. However, the state of the inspecting plated via portion described in JP 2012-18984 A and the state of the plated via portion of each suspension board do not necessarily have a high correlation. Therefore, reliability of the inspection result is low.

An object of the present invention is to provide a suspension board assembly sheet with circuits in which inspection of vias of a plurality of suspension boards can be performed in a short period of time and reliability of an inspection result can be improved, and a method for manufacturing the suspension board assembly sheet with circuits.

(1) According to one aspect of the present invention, a suspension board assembly sheet with circuits includes a plurality of suspension boards with circuits; an inspection substrate, and a support frame that integrally supports the plurality of suspension boards with circuits and the inspection substrate, wherein each of the plurality of the suspension boards with circuits includes a conductive first support substrate, a first insulating layer formed on the first support substrate, a conductor line formed on the first insulating layer and a first via that passes through the first insulating layer and electrically connects the first support substrate and the conductor line, and the inspection substrate includes a conductive second support substrate, a second insulating layer formed on the second support substrate, a conductor layer formed on the second insulating layer, and a second via that passes through the second insulating layer and electrically connects the second support substrate and the conductor layer, and the first via and the second via have the same configuration.

In this suspension board assembly sheet with circuits, the plurality of suspension boards with circuits and the inspection substrate are integrally supported by the support frame. In each of the plurality of suspension boards with circuits, the first insulating layer is formed on the conductive first support substrate. A conductor line is formed on the first insulating layer. The first support substrate and the conductor line are electrically connected by the first via that passes through the first insulating layer. In the inspection substrate, the second insulating layer is formed on the conductive second support substrate. A conductor layer is formed on the second insulating layer. The second support substrate and the conductor layer are electrically connected by the second via that passes through the second insulating layer.

In this case, the inspection substrate is formed to be integrally supported at the support frame similarly to the plurality of suspension boards with circuits, and the first vias of the plurality of suspension boards with circuits and the second via of the inspection substrate have the same configuration. Thus, the state of the first via and the state of the second via have a high correlation. Therefore, it is possible to perform the inspection of the first vias of the plurality of suspension boards in a short period of time and the reliability of the inspection result can be improved by performing the inspection of the second via of the inspection substrate.

(2) The second insulating layer may have an opening that is formed such that part of the second support substrate is exposed.

In this case, at the time of inspecting electric characteristics of the second via, a probe of an inspection device can be easily brought into contact with the second support substrate exposed in the opening. Thus, the electric characteristics of the second via can be efficiently and easily inspected.

(3) The opening may be formed such that a portion having length of not less than 300 μm of the second support substrate is exposed.

In this case, at the time of inspecting the electric characteristics of the second via, the probe of the inspection device can be easily brought into contact with the second support substrate exposed in the opening. Thus, the electric characteristics of the second via can be efficiently and easily inspected.

(4) The plurality of suspension boards with circuits may further include a third insulating layer formed on the first insulating layer to cover at least part of the conductor line and the first via, and the inspection substrate may further include a fourth insulating layer formed on the second insulating layer such that the fourth insulating layer covers the second via and at least part of the conductor layer is exposed.

In this case, at the time of inspecting the electric characteristics of the second via, the probe of the inspection device can be easily brought into contact with the exposed conductor layer. Thus, the electric characteristics of the second via can be efficiently and easily inspected. Further, the first via is prevented by the third insulating layer from corroding, and the second via is prevented by the fourth insulating layer from corroding. Thus, a correlation over time between the state of the second via of the inspection substrate and the states of the first vias of the plurality of the suspension boards with circuits can be prevented from being reduced.

(5) The fourth insulating layer may be formed such that a portion having a length of not less than 300 μm of the conductor layer is exposed.

In this case, at the time of inspecting the electric characteristics of the second via, the probe of the inspection device can be easily brought into contact with the exposed conductor layer. Thus, the electric characteristics of the second via can be efficiently and easily inspected.

(6) The plurality of suspension boards with circuits and the inspection substrate may be supported in alignment by the support frame.

In this case, it is possible to form more suspension boards with circuits and the inspection substrates at the suspension board assembly sheet with circuits without increasing the size of the support frame. Thus, a manufacturing cost of the suspension board assembly sheet with circuits can be reduced.

(7) The inspection substrate may be arranged between the suspension board with circuits at an end of the plurality of suspension boards with circuits and a portion of the support frame. In this case, inspection of the inspection substrate can be easily performed.

(8) The inspection substrate may be arranged between the pair of adjacent suspension boards with circuits of the plurality of suspension boards with circuits.

In this case, a correlation between the state of the second via of the inspection substrate and the states of the first vias of the plurality of suspension boards with circuits can be improved.

(9) A method for manufacturing a suspension board assembly sheet with circuits according to another aspect of the present invention includes the steps of preparing a base material having a laminate structure of a conductive support substrate and an insulating layer, forming a plurality of first insulating layers for a plurality of suspension boards with circuits and a second insulating layer for the inspection substrate by processing the insulating layer, respectively forming a first via electrically connected to the support substrate at the plurality of first insulating layers and forming a second via electrically connected to the support substrate at the second insulating layer, and respectively forming conductive lines on the plurality of first insulating layers to be electrically connected to the first via and forming a conductor layer on the second insulating layer to be electrically connected to the second via, and fabricating the plurality of suspension boards with circuits, the inspection substrate and a support frame by removing a region of the support substrate except for a region for the plurality of suspension boards with circuits, a region for the inspection substrate and a region for the support frame in the support substrate.

In the manufacturing method for this suspension board assembly sheet with circuits, the plurality of suspension boards with circuits and the inspection substrate are integrally supported by the support frame. In each of the plurality of suspension boards with circuits, the first insulating layer is formed on the conductive first support substrate. The conductor line is formed on the first insulating layer. The first support substrate and the conductor line are electrically connected by the first via that passes through the first insulating layer. In the inspection substrate, the second insulating layer is formed on the conductive second support substrate. The conductor layer is formed on the second insulating layer. The second support substrate and the conductor layer are electrically connected by the second via that passes through the second insulating layer.

In this case, the inspection substrate is formed to be integrally supported at the support frame similarly to the plurality of suspension boards with circuits, and the first vias of the plurality of suspension boards with circuits and the second via of the inspection substrate have the same configuration. Thus, the state of the first via and the state of the second via have a high correlation. Therefore, it is possible to perform the inspection of the first via of the plurality of suspension boards in a short period of time and reliability of the inspection result can be improved by performing the inspection of the second via of the inspection substrate.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 6 is a schematic cross sectional view of lines of the write wiring traces and their peripheral portions;

FIG. 14 is a diagram showing the relationship between a resistance value of a via of the inspection substrate and a resistance value of a via of the suspension board.

DESCRIPTION OF THE PREFERRED EMBODIMENTS

A suspension board assembly sheet with circuits and a method for manufacturing the suspension board assembly sheet with circuits according to one embodiment of the present invention will be described below with reference to drawings. The suspension board assembly sheet with circuits (hereinafter abbreviated as an assembly sheet) is a semi-finished product in the manufacturing process of the suspension board with circuits (hereinafter abbreviated as a suspension board). First, configuration of the assembly sheet will be described.

(1) Assembly Sheet

Figure 1:
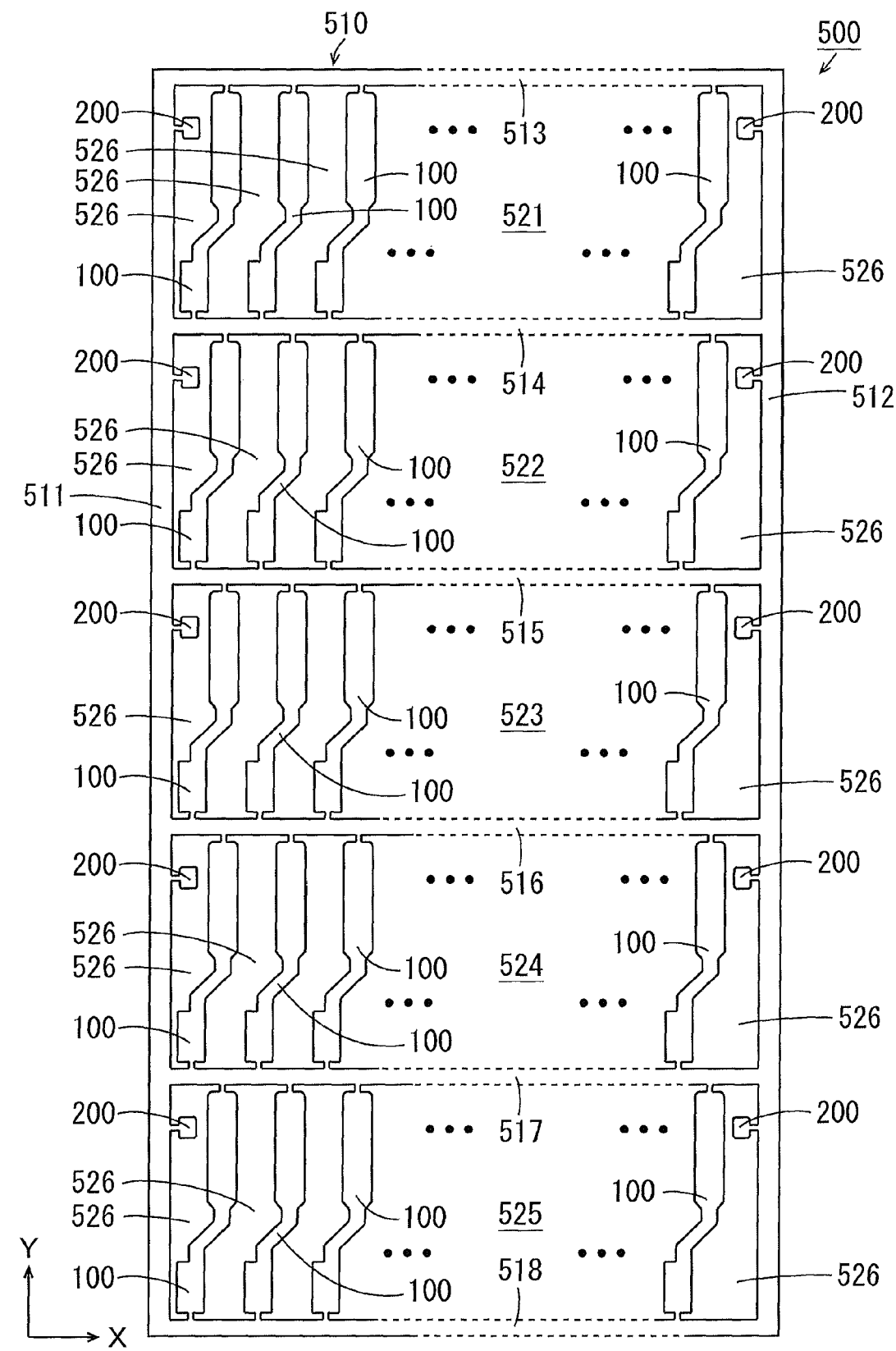
FIG. 1 is a top view of an assembly sheet according to one embodiment of the present invention.
Figure 2:
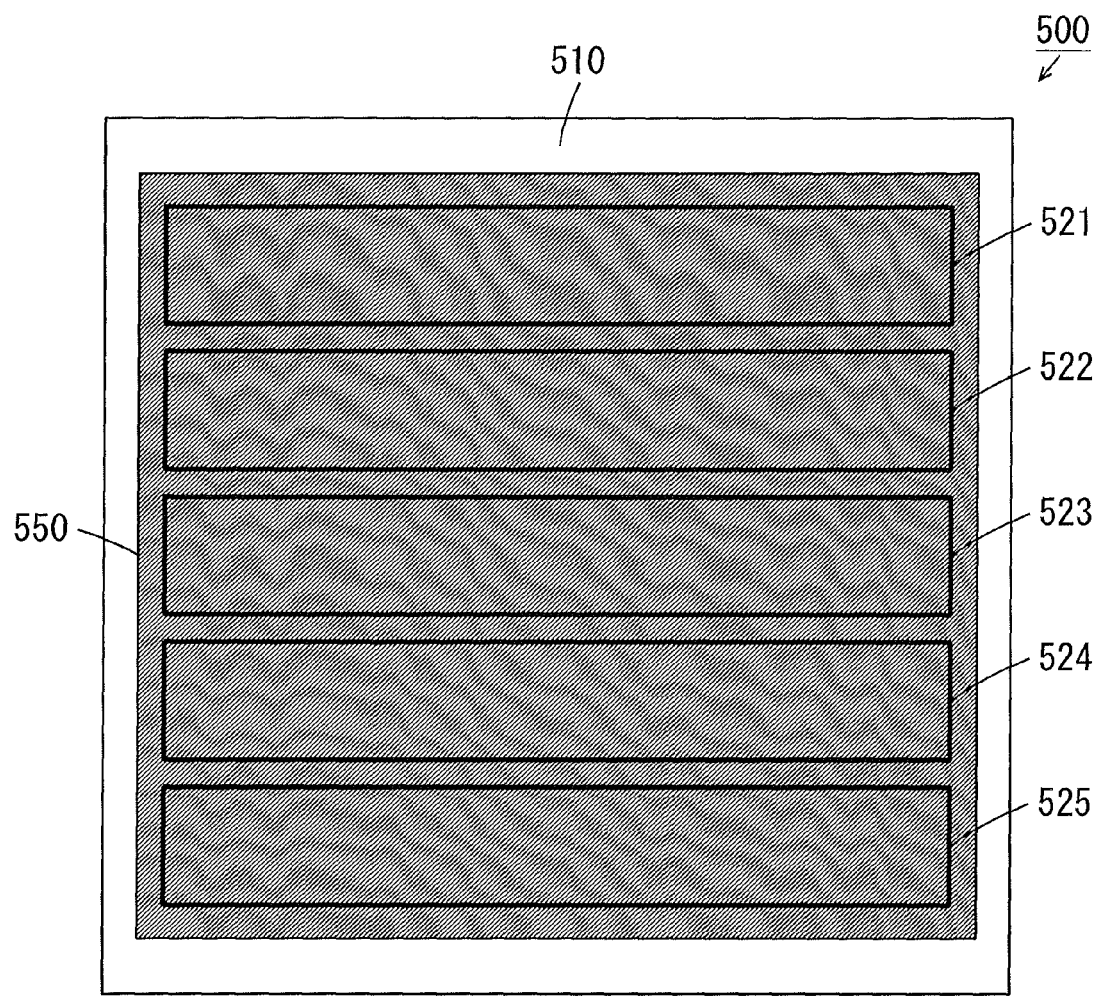
FIG. 2 is a top view of the assembly sheet according to the one embodiment of the present invention.
Figure 3:
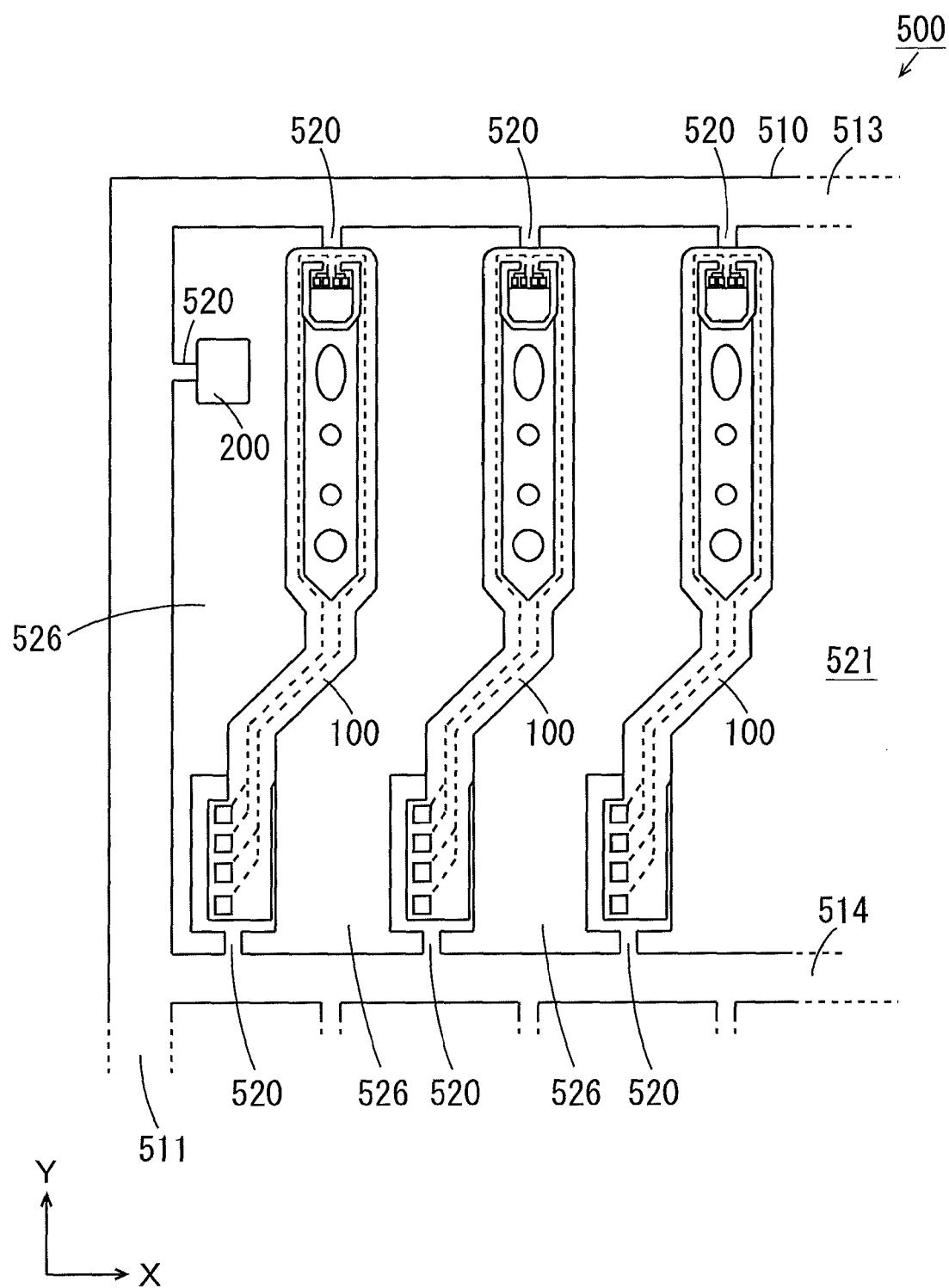
FIG. 3 is a partially enlarged top view of the assembly sheet of FIG. 1.

FIGS. 1 and 2 are top views of the assembly sheet according to the one embodiment of the present invention. Further, FIG. 3 is a partially enlarged top view of the assembly sheet 500 of FIG. 1. The assembly sheet 500 is fabricated from a long-sized metallic support substrate. In FIGS. 1 and 3, two directions that are orthogonal to each other are defined as the X direction and the Y direction as shown by the arrows X, Y. In the present example, the X direction and the Y direction are parallel to a horizontal plane. At the time of manufacturing, the plurality of assembly sheets 500 are fabricated to be arranged in the longitudinal direction at the long-sized support substrate. In FIG. 1, the one assembly sheet 500 on the support substrate is shown.

As shown in FIG. 1, the assembly sheet 500 has a rectangular outer shape, and includes a support frame 510, a plurality of long-sized suspension boards 100 and a plurality of inspection substrates 200 (substrates 200 for inspection). As shown in FIG. 2, a region (hereinafter referred to as a product guarantee region) 550 is set inside of a support frame 510. In FIG. 2, the product guarantee region 550 is shown by a hatching pattern. The product guarantee region 550 is a region in which each suspension board 100 is to be protected to satisfy a predetermined specification. The support frame 510 is made of a pair of side frames 511, 512 and a plurality of end frames 513, 514, 515, 516, 517, 518.

The pair of side frames 511, 512 is opposite to each other, and extends in the Y direction. The end frames 513 to 518 respectively extend in the X direction that is orthogonal to the pair of side frames 511, 512, and are formed to connect the pair of side frames 511, 512. The end frames 513 to 518 are arranged at equal intervals in the Y direction from the one end to the other end of the pair of side frames 511, 512. Thus, a plurality (five in the present example) of rectangular regions 521, 522, 523, 524, 525 that are partitioned by the side frames 511, 512 and the end frames 513 to 518 are formed inside of the product guarantee region 550. In FIG. 2, the rectangular regions 521 to 525 inside of the product guarantee region 550 are surrounded by the bold solid line.

The plurality of suspension boards 100 are provided to extend in the Y direction and to be arranged in the X direction in the rectangular regions 521 to 525. A separation groove 526 is formed along the outer peripheral edge of each suspension board 100. In the present embodiment, in each of the rectangular regions 521 to 525, the inspection substrate 200 is provided in the separation groove 526 between the suspension board 100 at one end in the X direction and the side frame 511. Further, in each of the rectangular regions 521 to 525, the inspection substrate 200 is provided in the separation groove 526 between the suspension board 100 at the other end in the X direction and the side frame 512.

As shown in FIG. 3, both ends of each suspension board 100 in the Y direction are coupled to the support frame 510 using coupling portions 520. In the separation groove 526 between the one side frame 511 and the suspension board 100 adjacent to the side frame 511, the inspection substrate 200 is coupled to the side frame 511 using the coupling portion 520. Similarly, in the separation groove 526 between the other side frame 512 and the suspension board 100 adjacent to the side frame 512, the inspection suspension 200 is coupled to the side frame 512 using the coupling portion 520.

In this manner, in each rectangular region 521 to 525, the plurality of suspension boards 100 and the plurality of inspection substrates 200 are supported in alignment by the support frame 510. Therefore, it is possible to form more suspension boards 100 and the inspection substrates 200 at the assembly sheet 500 without increasing the size of the support frame 510. Thus, a manufacturing cost of the assembly sheet 500 can be reduced. The coupling portions 520 are cut after the assembly sheet 500 is manufactured such that each suspension board 100 and each inspection substrate 200 are separated from the support frame 510.

(2) Configuration of Suspension Board

Figure 4:
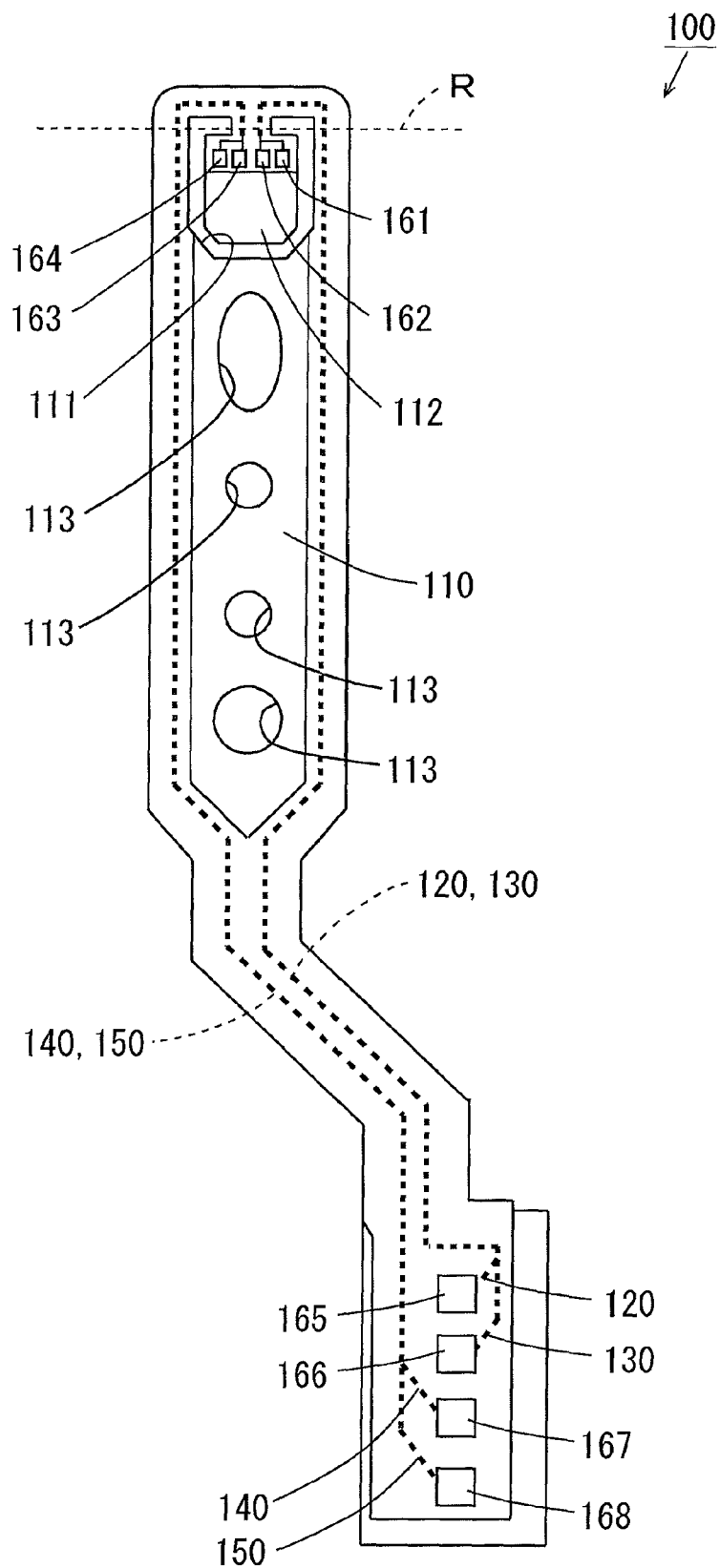
FIG. 4 is a top view of a suspension board of FIG. 1.

FIG. 4 is a top view of the suspension board 100 of FIG. 1. As shown in FIG. 4, the suspension board 100 includes a support substrate 110 formed of a metallic long-sized substrate. Write wiring traces 120, 130 and read wiring traces 140, 150 are formed on the support substrate 110 as indicated by the bold dotted line. In FIG. 4, the write wiring traces 120, 130 are indicated by the single dotted line, and the read wiring traces 140, 150 are indicated by the single dotted line. The write wiring trace 120 and the write wiring trace 130 constitute a signal line pair. Further, the write wiring trace 140 and the read wiring trace 150 constitute a signal line pair.

At the tip of the support substrate 110, a magnetic head supporting portion (hereinafter referred to as a tongue) 112 is provided by forming a U-shaped opening 111. The tongue 112 is bent along the broken line R to form a predetermined angle with respect to the support substrate 110. Four electrode pads 161, 162, 163, 164 are formed at the end of the tongue 112.

Four electrode pads 165, 166, 167, 168 are formed at the other end of the support substrate 110. The electrode pads 161 to 164 on the tongue 112 and the electrode pads 165 to 168 at the other end of the support substrate 110 are electrically connected by the write wiring traces 120, 130 and the read wiring traces 140, 150, respectively. Further, a plurality of holes 113 are formed at the support substrate 110.

In a hard disc drive device (not shown) that includes the suspension board 100, a current flows in the pair of write wiring traces 120, 130 at the time of writing information to a magnetic disc. Further, a current flows in the pair of read wiring traces 140, 150 at the time of reading the information from the magnetic disc.

(3) Write Wiring Traces

Figure 5:
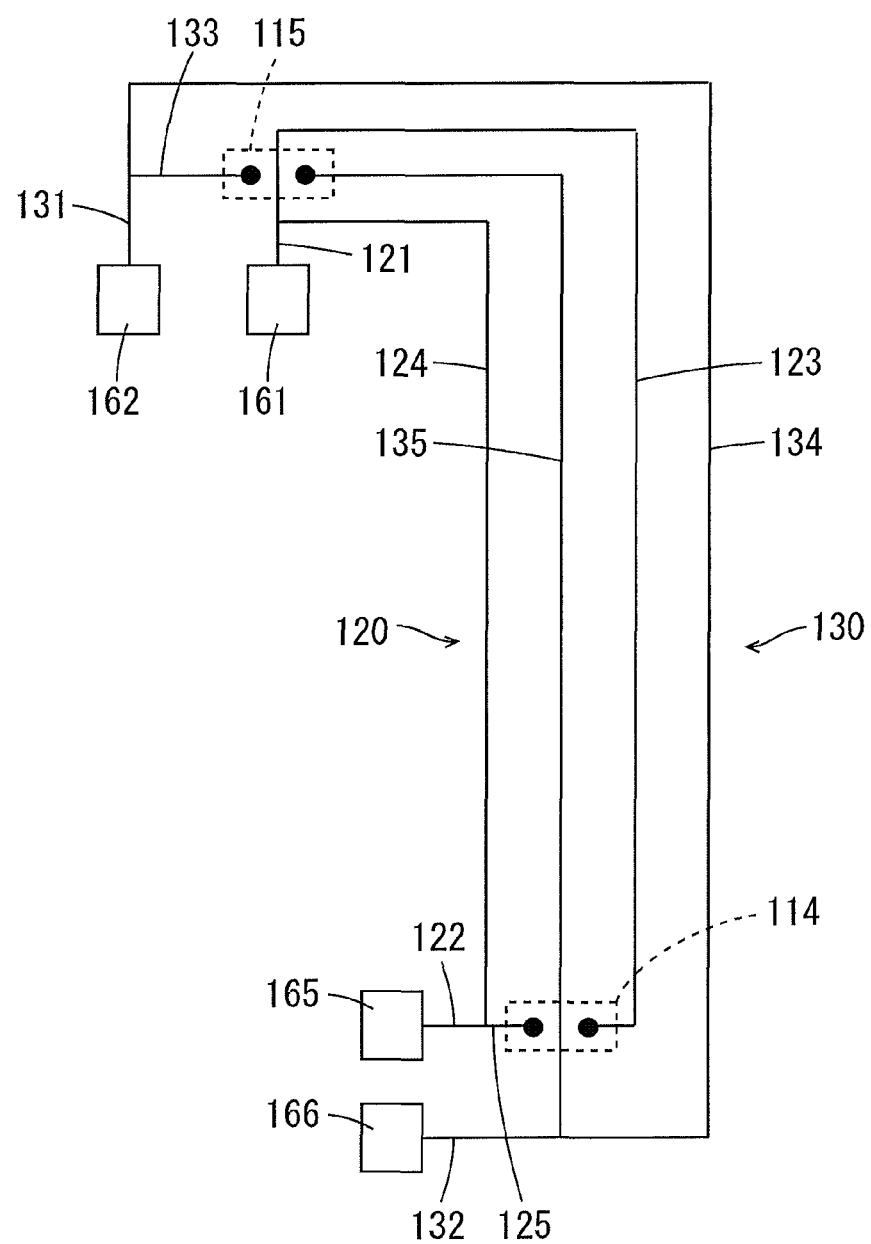
FIG. 5 is a schematic diagram showing the configuration of write wiring traces.

Next, detailed configuration of the write wiring traces 120, 130 will be described. FIG. 5 is a schematic diagram showing the configuration of the write wiring traces 120, 130. As shown in FIG. 5, the write wiring trace 120 is constituted by lines 121 to 125. The line 121 is connected to the electrode pad 161, and the line 122 is connected to the electrode pad 165.

One end of each of the lines 123, 124 is integrated into the line 121. The other end of the line 123 and the one end of the line 125 are electrically connected in an intersection region 114. The details of the intersection region 114 will be described below. The other end of each of the lines 124, 125 is integrated into the line 122.

The write wiring trace 130 is constituted by the lines 131 to 135. The line 131 is connected to the electrode pad 162, and the line 132 is connected to the electrode pad 166. The one end of each of the lines 133, 134 is integrated into the line 131. The other end of the line 133 and the one end of the line 135 are electrically connected in an intersection region 115. The details of the intersection region 115 will be described below. The other end of each of the lines 134, 135 is integrated into the line 132.

The lines 123, 124 of the write wiring trace 120 and the lines 134, 135 of the write wiring trace 130 are arranged to alternate and to be parallel to each other. The line 123 of the write wiring trace 120 extends in-between the ends of the lines 133, 135 of the write wiring trace 130 in the intersection region 115, and the line 135 of the write wiring trace 130 extends in-between the ends of the lines 123, 125 of the write wiring trace 120 in the intersection region 114.

FIG. 6 is a schematic cross sectional view of the lines 123, 124, 134, 135 of the write wiring traces 120, 130 and their peripheral portions. As shown in FIG. 6, a base insulating layer 170 is formed on the support substrate 110. The lines 123, 124, 134, 135 of the write wiring traces 120, 130 are formed on the base insulating layer 170. A cover insulating layer 180 is formed on the base insulating layer 170 to cover the write wiring traces 120, 130.

Figure 7:
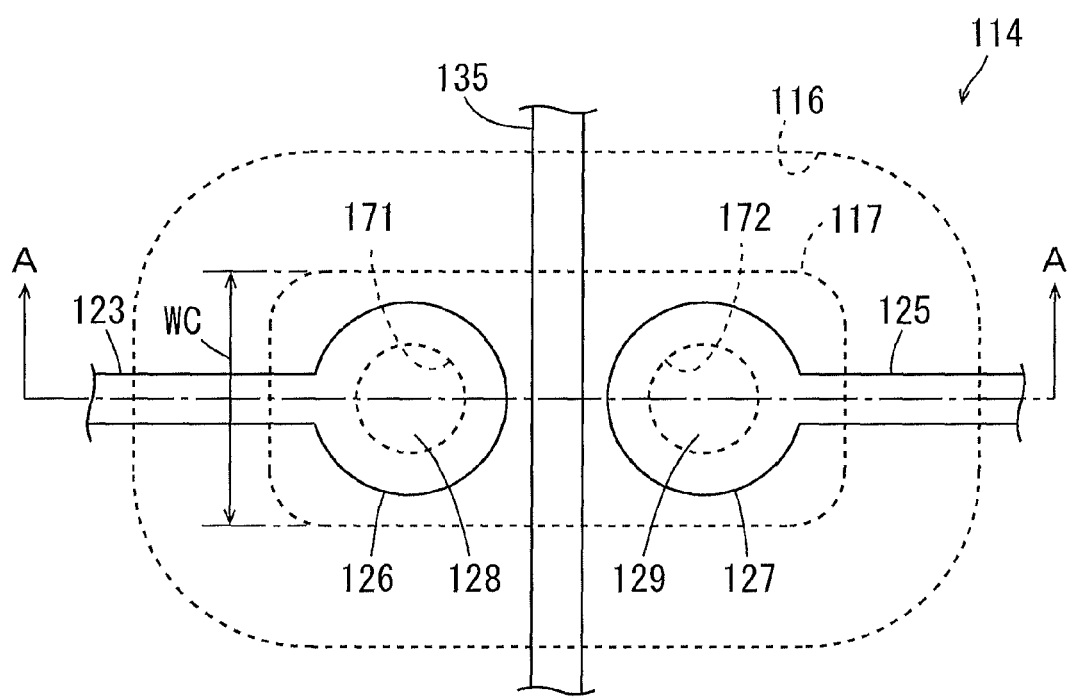
FIGS. 7(a) and 7(b) are diagrams showing an intersection region of FIG. 5 and its periphery.
Figure 7:
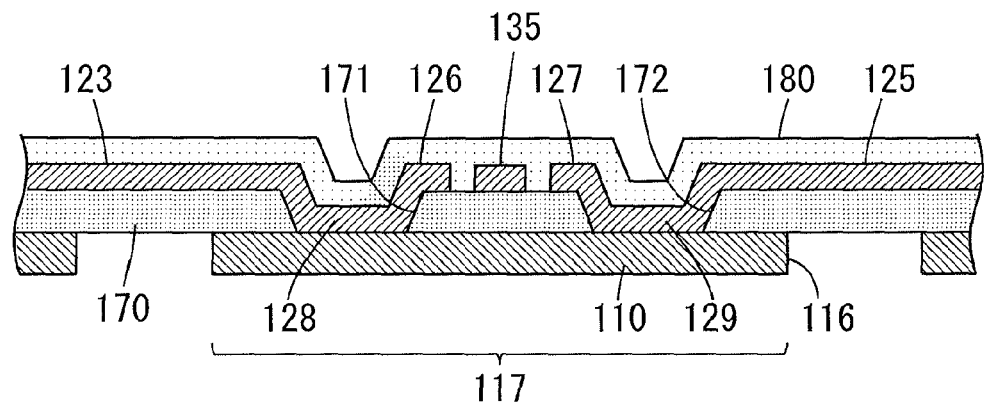

FIGS. 7(*a*) and 7(*b*) are diagrams showing the intersection region 114 of FIG. 5 and its periphery. FIG. 7(*a*) shows a detailed plan view of the intersection region 114, and FIG. 7(*b*) shows a cross sectional view taken along the line A-A of FIG. 7(*a*). The intersection region 115 has the configuration similar to the intersection region 114.

As shown in FIGS. 7(*a*) and 7(*b*), an annular opening 116 is formed at the support substrate 110. Thus, an island-shaped region 117 that is electrically separated from other regions of the support substrate 110 is formed. The line 135 of the write wiring trace 130 is arranged to extend and pass through a portion over the region 117 of the support substrate 110, and the end of the line 123 and the end of the line 125 of the write wiring trace 120 are arranged on both sides of the line 135.

Circular connection portions 126, 127 are provided at the ends of the line 123 and the line 125, respectively. In addition, through holes 171, 172 are formed in portions of the base insulating layer 170 below the connection portions 126, 127, respectively. Each of the through holes 171, 172 is formed in a tapered shape such that the diameter thereof is gradually reduced as approaching the lower surface from the upper surface of the base insulating layer 170.

The connection portion 126 comes into contact with the region 117 of the support substrate 110 in the through hole 171, and the connection portion 127 comes into contact with the region 117 of the support substrate 110 in the through hole 172. A via 128 is formed of a portion of the connection portion 126 in the through hole 171, and a via 129 is formed of a portion of the connection portion 127 in the through hole 172. This causes the lines 123, 125 to be electrically connected through the vias 128, 129 and the region 117 of the support substrate 110.

The diameter of the connection portion 126 is preferably larger than the width of the line 123, and the diameter of the connection portion 127 is preferably larger than the width of the line 125. In addition, the diameter of the through hole 171 of the base insulating layer 170 is preferably larger than the width of the line 123, and the diameter of the through hole 172 is preferably larger than the width of the line 125.

Thus, the electrical connection between the lines 123, 125 is sufficiently ensured.

Note that the width WC of the region 117 of the support substrate 110 is preferably constant in its portion between a contact portion of the region 117 with the connection portion 126 and a contact portion of the region 117 with the connection portion 127. In this case, transmission loss in the region 117 of the support substrate 110 is reduced.

The shape of each of the connection portions 126, 127 is not limited to the circular. For example, another shape such as an elliptical shape, a triangular shape, a quadrangular shape and a shape of a sector may be employed. The transverse cross sectional shape of each of the through holes 171, 172 may be another shape such as an elliptical shape, a triangular shape, a quadrangular shape and a shape of a sector.

(4) Configuration of Inspection Substrates

Figure 8:
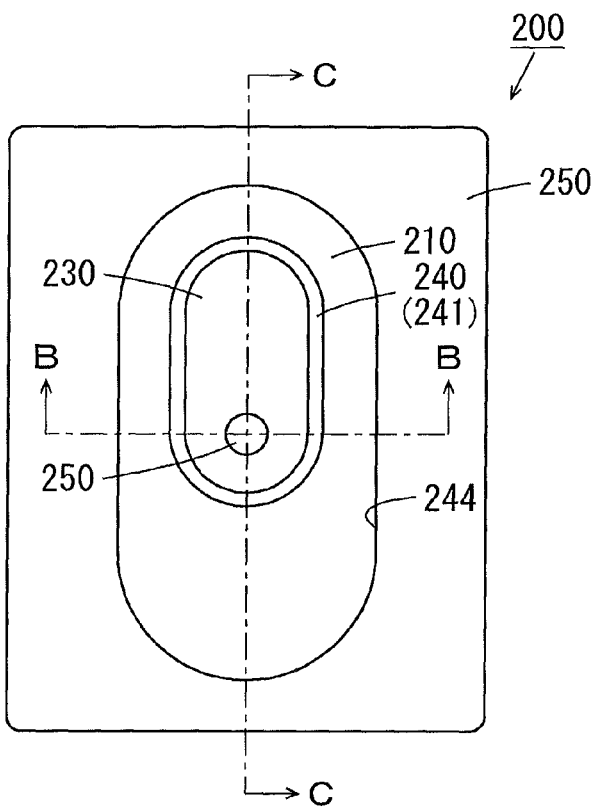
FIGS. 8(a) to 8(c) are diagrams showing the configuration of an inspection substrate.
Figure 8:
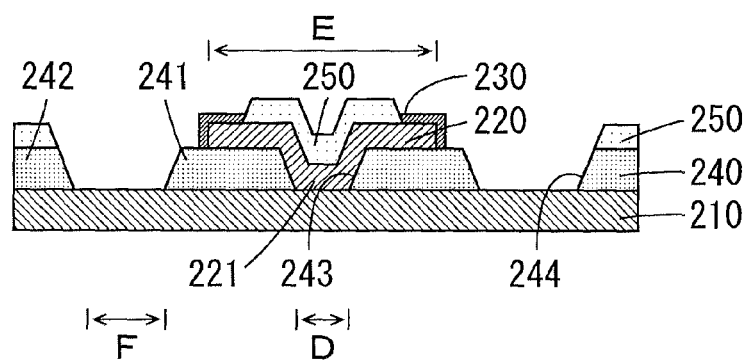
Figure 8:
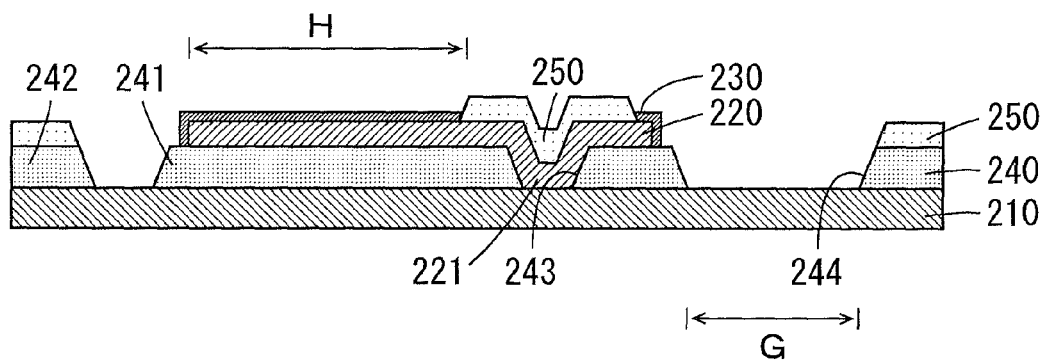

FIGS. 8(*a*) to 8(*c*) are diagrams showing the configuration of the inspection substrate 200. FIG. 8(*a*) shows a top view of the inspection substrate 200. FIG. 8(*b*) shows a cross sectional view taken along the line B-B of FIG. 8(*a*). FIG. 8(*c*) shows a cross sectional view taken along the line C-C of FIG. 8(*a*).

As shown in FIGS. 8(*a*) to 8(*c*), inspection substrate 200 includes a support substrate 210 formed of a metallic long-sized substrate. A base insulating layer 240 is formed on the support substrate 210. An annular opening 244 is formed at the base insulating layer 240. Thus, the base insulating layer 240 is separated into an island-shape inner region 241 and an outer region 242 that surrounds the inner region 241. The support substrate 210 is exposed from the opening 244 between the inner region 241 and the outer region 242.

A through hole 243 is formed at the inner region 241 of the base insulating layer 240. The through hole 243 is formed in a tapered shape such that the diameter thereof is gradually reduced as approaching the lower surface from the upper surface of the base insulating layer 240. The transverse cross sectional shape of each of the through holes 243 may be another shape such as circular shape, elliptical shape, triangular shape, a quadrangular shape and a shape of a sector.

A conductor layer 220 is formed on the inner region 241. Part of the conductor layer 220 comes into contact with the support substrate 210 in the through hole 243. A via 221 is formed of a portion of the conductor layer 220 in the through hole 243. Thus, the conductor layer 220 and the support substrate 210 are electrically connected through the via 221. The vias 128, 129 of the support substrate 110 of FIGS. 7(*a*) and 7(*b*) and the via 221 of the support substrate 210 have the same configuration.

In the present example, the inspection substrates 200 are formed inside of the product guarantee region 550 of the assembly sheet 500 of FIG. 2. At least, the vias 221 of the inspection substrates 200 are formed inside of the product guarantee region 550 of the assembly sheet 500.

A plating layer 230 is formed on the surface of the conductor layer 220 except for a portion of the via 221 of the conductor layer 220. A cover insulating layer 250 is formed to cover the outer region 242 of the base insulating layer 240 and the via 221 of the conductor layer 220.

The opening 244 is preferably formed such that a portion having a length of not less than 300 μm and not more than 1500 μm of the G portion of FIG. 8(*c*) of the support substrate 210 is exposed. In this case, at the time of inspecting the electric characteristics of the via 221, a probe of an inspection device can be more easily brought into contact with the support substrate 210 exposed in the opening 244. Thus, the electric characteristics of the via 221 can be more efficiently and easily inspected.

Further, the cover insulating layer 250 is preferably formed such that a portion having the length of not less than 300 µm and not more than 1500 µm of the H portion of FIG. 8(b) of the conductor layer 220 is exposed from the cover insulating layer 250. In this case, at the time of inspecting the electric characteristics of the via 221, the probe of the inspection device can be more easily brought into contact with the exposed conductor layer 220. Thus, the electric characteristics of the via 221 can be more efficiently and easily inspected.

In the present example, the minimum diameter of the through hole 243 (the D portion of FIG. 8(b)) is set to not less than 20 µm and not more than 100 µm. The length of the shortest portion of the conductor layer 220 (the E portion of FIG. 8(b)) is set to not less than 300 µm and not more than 1500 µm. The width of the shortest portion of the opening 244 (the F portion of FIG. 8(b)) is set to not less than 50 µm and not more than 500 µm. The width of the longest portion of the opening 244 (the G portion of FIG. 8(c)) is set to not less than 300 µm and not more than 1500 µm. The length of the longest portion of the conductor layer 220 (the H portion of FIG. 8(c)) that is exposed from the cover insulating layer 250 is set to not less than 300 µm and not more than 1500 µm.

(5) Manufacturing Method of Assembly Sheet

Figure 9:
FIGS. 9(a) and 9(b) are sectional views for use in illustrating steps of one example in a method for manufacturing the assembly sheet according to the one embodiment of the present invention.
Figure 9:
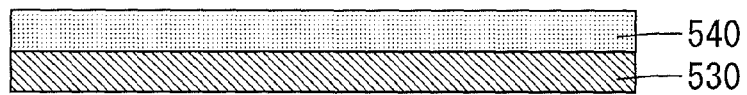
Figure 9:
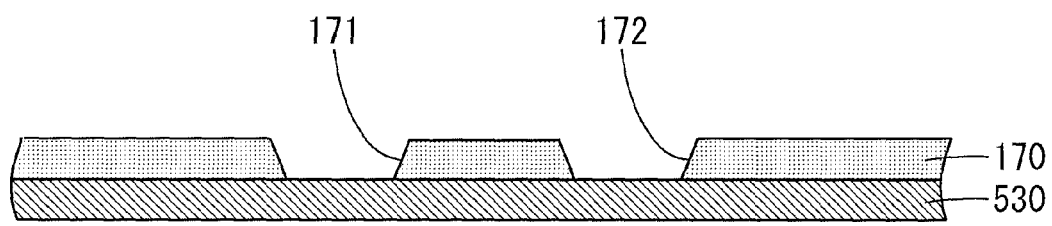
Figure 9:
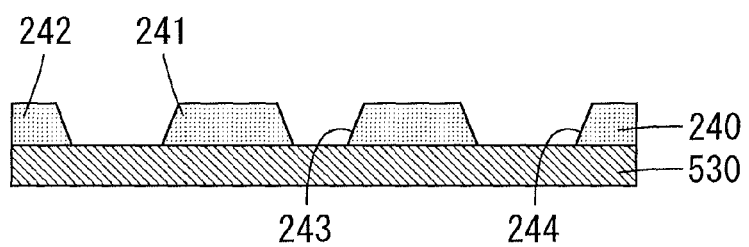
Figure 10:
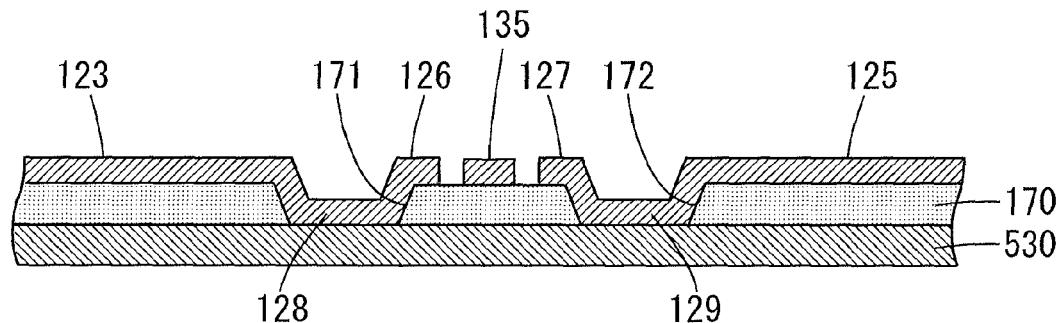
FIGS. 10(a) and 10(b) are sectional views for use in illustrating steps of one example in a method for manufacturing the assembly sheet according to the one embodiment of the present invention.
Figure 10:
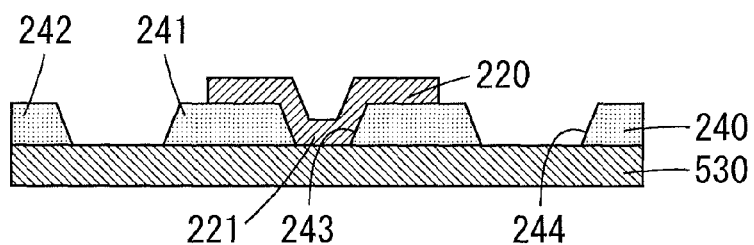
Figure 10:
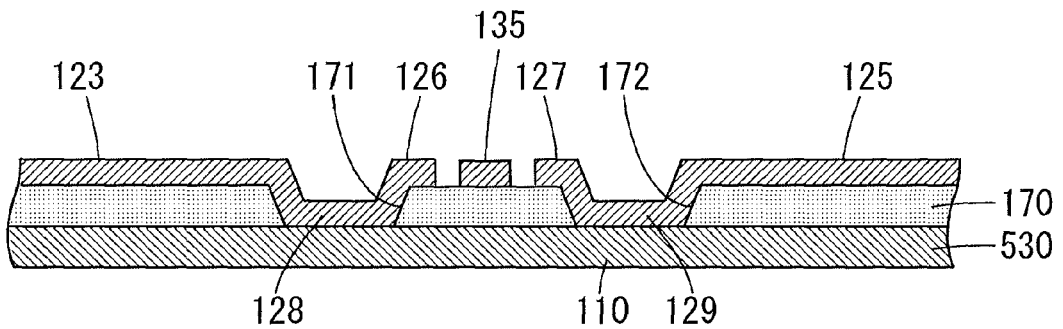
Figure 10:
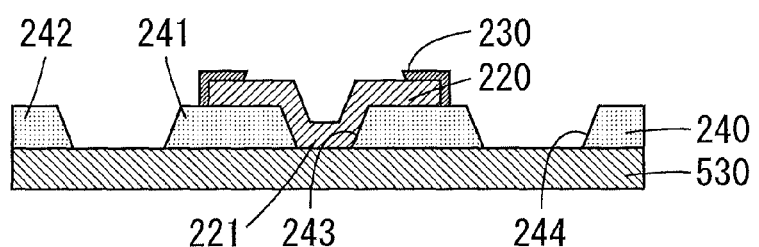
Figure 11:
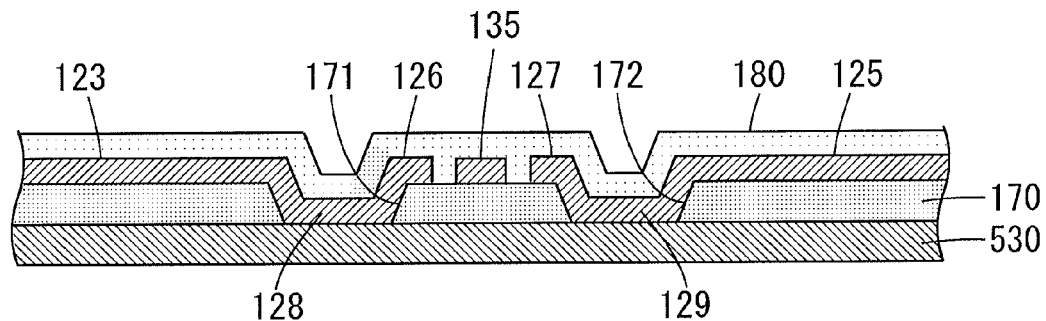
FIGS. 11(a) and 11(b) are sectional views for use in illustrating steps of one example in a method for manufacturing the assembly sheet according to the one embodiment of the present invention.
Figure 11:
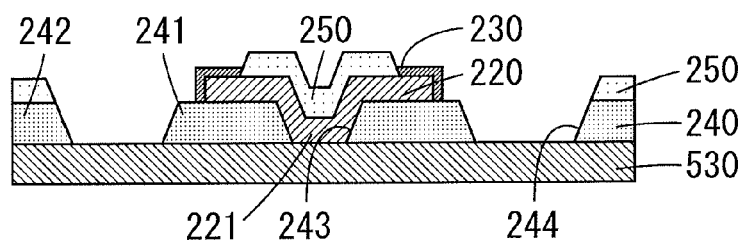
Figure 11:
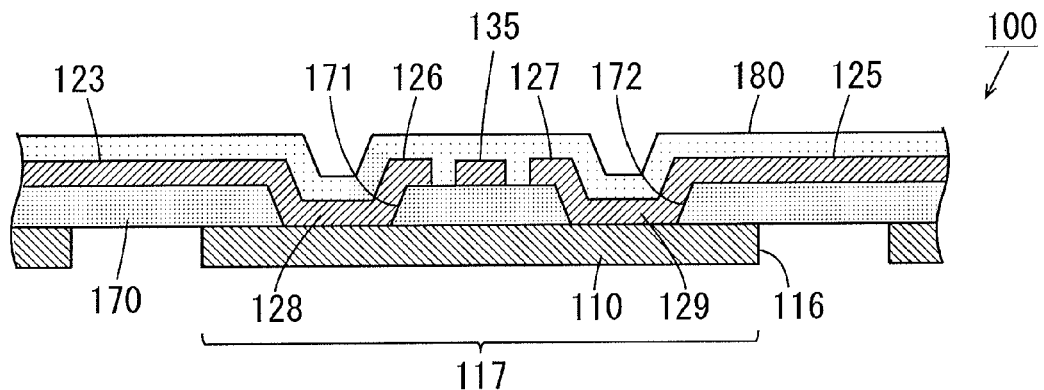
Figure 11:
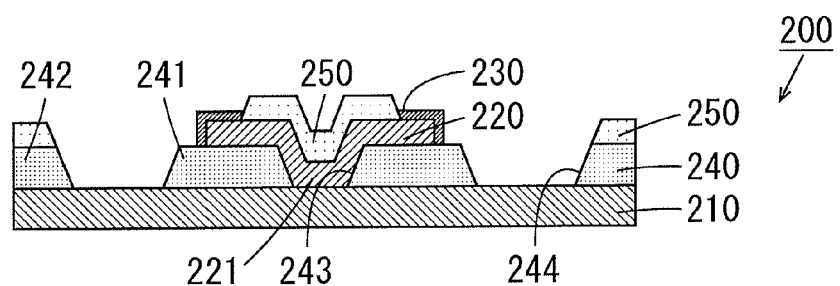

Next, the manufacturing method for the assembly sheet 500 will be described. In the present example, the plurality of assembly sheets 500 are formed on the long-sized support substrate by a role-to-role system. FIGS. 9, 10 and 11 are sectional views for use in illustrating steps of one example in a method of manufacturing the assembly sheet 500 according to the one embodiment of the present invention. The upper diagrams in FIGS. 9(a) to 11(b) correspond to the cross sectional views taken along the line A-A of FIG. 7(a). The lower diagrams in FIGS. 9(a) to 11(b) correspond to the cross sectional views taking along the line B-B of FIG. 8(a).

First, as shown in FIG. 9(a), a base insulating layer 540 made of polyimide is formed on the long-sized support substrate 530 made of stainless steel. A two-layer base material having a laminate structure of the support substrate 530 and the base insulating layer 540 may be used.

Material for the support substrate 530 is not limited to stainless steel, and another metallic material such as aluminum (Al) may be used. The thickness of the support substrate 530 is not less than 10 µm and not more than 30 µm, for example, and is preferably not less than 12 µm and not more than 20 µm. Material for the base insulating layer 540 is not limited to polyimide, and another resin material such as epoxy may be used. The thickness of the base insulating layer 540 is not less than 3 µm and not more than 20 µm, for example, and is preferably not less than 5 µm and not more than 15 µm.

Then, as shown in FIG. 9(b), the base insulating layer 540 is etched, for example, whereby the base insulating layer 170 for the suspension board 100 is formed and the base insulating layer 240 for the inspection substrate 200 is formed. Simultaneously, in the intersection regions 114, 115 of FIG. 5, the through holes 171, 172 are formed at portions of the base insulating layer 170. Further, the annular opening 244 is formed at the base insulating layer 240, whereby the inner region 241 and the outer region 242 are formed and the through hole 243 is formed in the inner region 241. The minimum diameters of the through holes 171, 172 are not less than 20 µm and not more than 200 µm, for example, and are preferably not less than 40 µm and not more than 100 µm.

Subsequently, as shown in FIG. 10(a), the write wiring traces 120, 130, the read wiring traces 140, 150 and the electrode pads 161 to 168 of FIG. 4 that are made of copper are formed on the base insulating layer 170 by electrolytic plating and the like, and the conductor layer 220 made of copper is formed on the base insulating layer 240. In FIG. 10(a), only the lines 123, 125 and the connection portions 126, 127 of the write wiring trace 120, and the line 135 of the write wiring trace 130 are shown.

A portion of the connection portion 126 in the through hole 171 is the via 128, a portion of the connection portion 127 in the through hole 172 is the via 129 and a portion of the conductor layer 220 in the through hole 243 is the via 221. The write wiring traces 120, 130 and the read wiring traces 140, 150, and the conductor layer 220 may be formed using an additive method, may be formed using a semi-additive method or may be formed using another method such as a subtractive method.

Material for the write wiring traces 120, 130, the read wiring traces 140, 150, the electrode pads 161 to 168 and the conductor layer 220 is not limited to copper, and another metal such as gold (Au) or aluminum, or an alloy such as a copper alloy or an aluminum alloy may be used. The thickness of the write wiring traces 120, 130 and the read wiring traces 140, 150 is not less than 3 µm and not more than 16 µm, for example, and is preferably not less than 6 µm and not more than 13 µm. The width of the write wiring traces 120, 130 and the read wiring traces 140, 150 is not less than 12 µm and not more than 60 µm, for example, and is preferably not less than 16 µm and not more than 50 µm.

Thereafter, as shown in FIG. 10(b), the plating layer 230 made of gold (Au), for example, is formed on the surface of the conductor layer 220 except for the via 221 of the conductor layer 220. Simultaneously, a plating layer similar to the plating layer 230 is formed on the surface of the electrode pads 161 to 168 of FIG. 4.

Next, as shown in FIG. 11(a), the cover insulating layer 180 made of polyimide is formed on the base insulating layer 170 to cover the write wiring traces 120, 130 and the read wiring traces 140, 150. Simultaneously, the cover insulating layer 250 made of polyimide is formed to cover the outer region 242 of the base insulating layer 240 and the via 221 of the conductor layer 220. Material for the cover insulating layers 180, 250 is not limited to polyimide, and another insulating material such as epoxy may be used. The thickness of the cover insulating layers 180, 250 is not less than 3 µm and not more than 30 µm, for example, and is preferably not less than 5 µm and not more than 10 µm.

Subsequently, the support substrate 530 is etched, for example, such that the separation grooves 526 of FIG. 1 are formed at the support substrate 530 and the annular opening 116 of FIG. 7(b) is formed in the intersection regions 114, 115 of FIG. 5. Simultaneously, the opening 111 and the plurality of holes 113 of FIG. 3 are formed at the support substrate 530. Further, the long-sized support substrate 530 is cut at constant intervals such that each of the assembly sheets 500 is separated.

Thus, as shown in FIG. 11(b), the support substrate 110 for the suspension board 100, the support substrate 210 for the inspection substrate 200, the support frame 510 and the coupling portion 520 of FIG. 3 are formed. Further, the annular opening 116 is formed at the support substrate 110, and the region 117 separated from other regions is formed at the support substrate 110. The area of the region 117 is not less than 3200 µm² and not more than 18000 µm², for example, and is preferably not less than 5000 µm² and not more than 80000 µm².

The assembly sheet 500 that includes the plurality of suspension boards 100, the plurality of inspection substrates 200 and the support frame 510 is completed by the above-mentioned steps.

(6) Inspection of Inspection Substrate

Inspection for the via 221 of the inspection substrate 200 formed at the assembly sheet 500 is performed. For example, one probe of the inspection device, is brought into contact with the plating layer 230 of the inspection substrate 200, and another probe is brought into contact with the support substrate 210 exposed in the opening 244 of the inspection substrate 200. Thus, the resistance value of the via 221 can be measured.

In this case, as described below, the resistance value of the via 221 of each inspection substrate 200 and the resistance values of the vias 128, 129 of the suspension board 100 have a high correlation. Therefore, it is possible to inspect whether or not the electric characteristics of the vias 128, 129 of the plurality of suspension substrate 100 are good by measuring the resistance value of the via 221 of the inspection substrate 200. Therefore, the inspection of vias 128, 129 of the plurality of suspension boards 100 can be performed in a short period of time, and the reliability of the inspection results can be improved.

After the inspection, the plurality of coupling portions 520 of the assembly sheet 500 and the plurality of coupling portions 520 of the assembly sheet 500 are cut such that the plurality of suspension boards 100 and the plurality of inspection substrates 200 can be separated from the support frame 510. The plurality of inspection substrates 200 do not have to be separated from the assembly sheet 500, or may be separated from the assembly sheet 500. The inspection of the via 221 of the inspection substrate 200 may be performed after the inspection substrate 200 is separated from the assembly sheet 500.

(7) First Modified Example

While the inspection substrate 200 is provided in the separation groove 526 between the suspension board 100 at the one end and the side frame 511, and in the separation groove 526 between the suspension board 100 at the other end and the side frame 512 in each of the rectangular regions 521 to 525 in the X direction in the afore-mentioned embodiment, the invention is not limited to this.

The inspection substrate 200 may be provided in the separation groove 526 between the suspension substrate 100 at the one end and the side frame 511 in each of the rectangular regions 521 to 525 in the X direction, and the inspection substrate 200 does not have to be provided in the separation groove 526 between the suspension board 100 at the other end and the side frame 512. Alternatively, the inspection substrate 200 may be provided in the separation groove 526 between the suspension board 100 at the other end and the side frame 511 in each of the rectangular regions 521 to 525 in the X direction, and the inspection substrate 200 does not have to be provided in the separation groove 526 between the suspension board 100 at the one end and the side frame 512.

Figure 12:
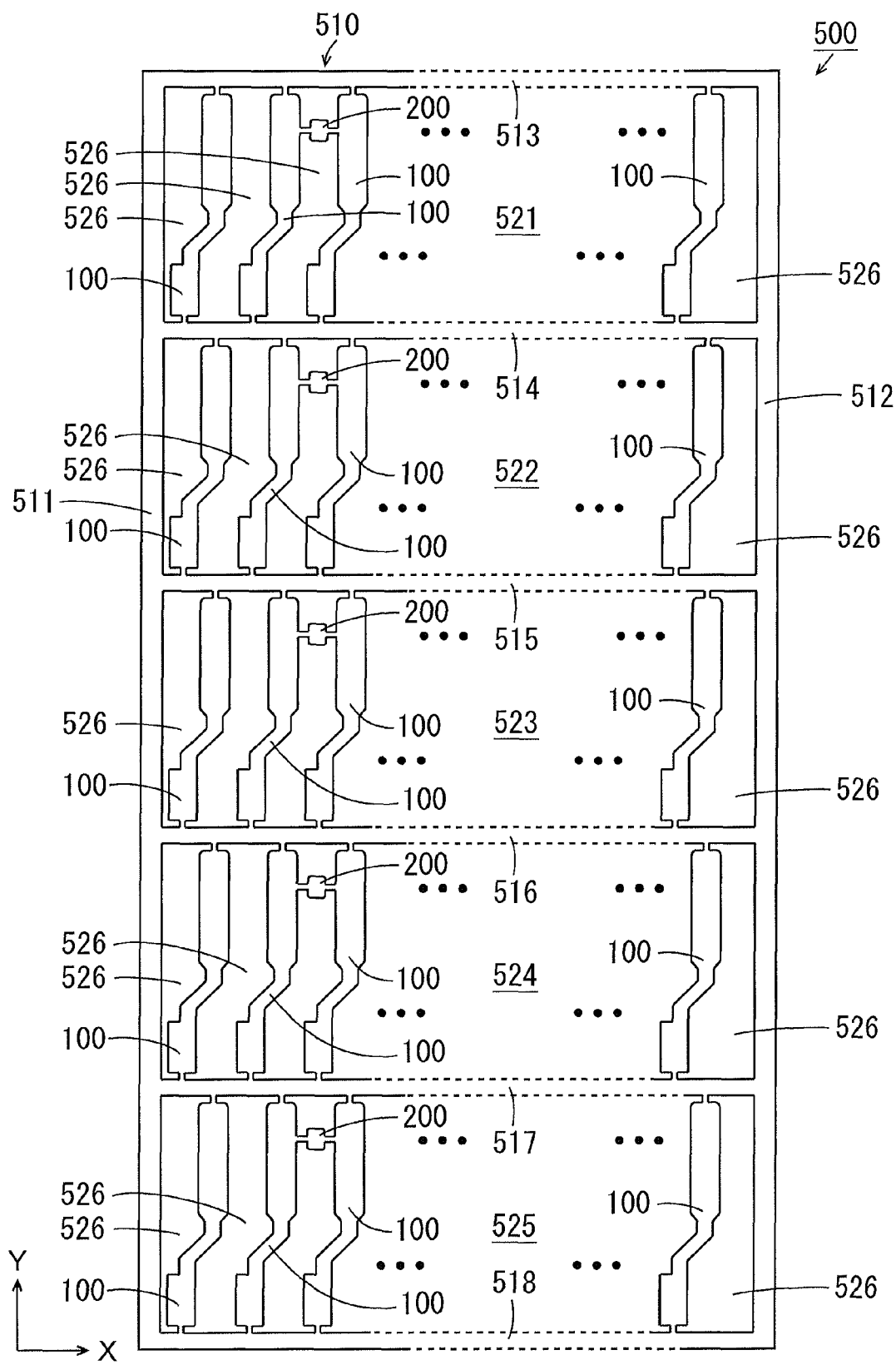
FIG. 12 is a top view of the assembly sheet according to a first modified example.

FIG. 12 is a top view of the assembly sheet 500 according to the first modified example. As shown in FIG. 12, in the assembly sheet 500 according to the first modified example, the inspection substrate 200 is provided in the separation groove 526 between the pair of adjacent suspension boards 100 of the plurality of suspension boards 100 in each of the rectangular regions 521 to 525 in the X direction. In this case, the correlation between the state of the via 221 of the inspection substrate 200 and the states of the vias 128, 129 of the plurality of suspension boards 100 can be improved.

Further, the inspection substrate 200 may be supported at the support frame 510 using the suspension boards 100 on both sides as shown in FIG. 12, or may be supported at the support frame 510 using the suspension board 100 on the one side. Alternatively, the inspection substrate 200 may be directly supported at the support frame 510 without using the suspension board 100.

(8) Second Modified Example

Figure 13:
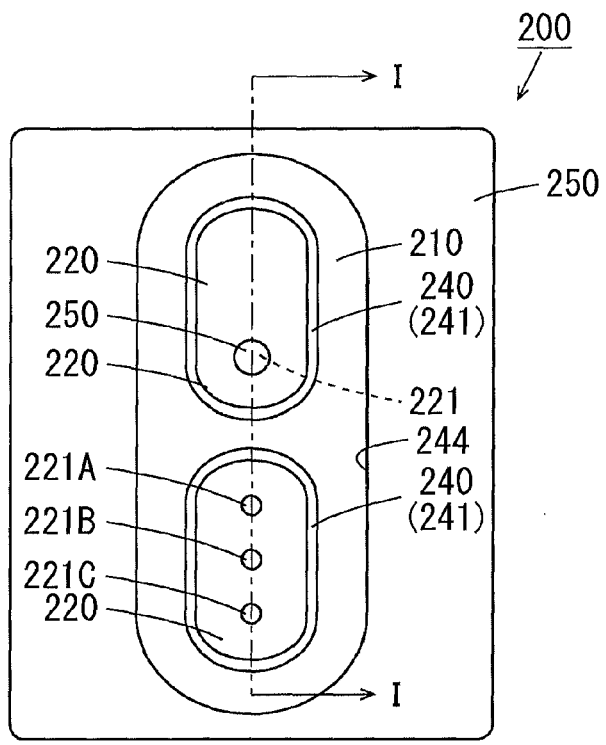
FIGS. 13(a) and 13(b) are diagrams showing the configuration of the inspection substrate of the assembly sheet according to a second modified example.
Figure 13:
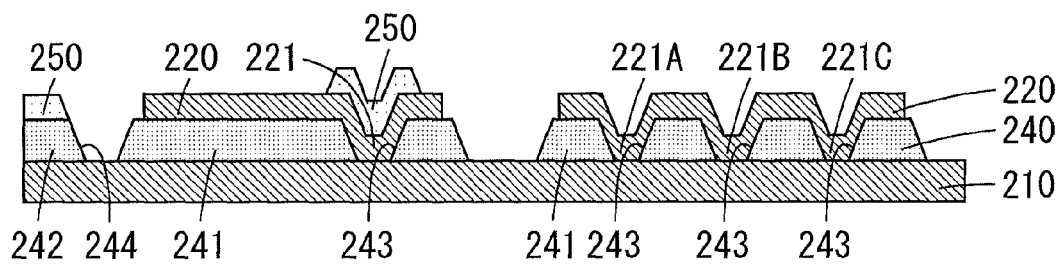

While the one via 221 is provided at the one inspection substrate 200 in the above-mentioned embodiment, the invention is not limited to this. Multiple types of vias 221 may be provided at the one inspection substrate 200. FIGS. 13(a) and 13(b) are diagrams showing the configuration of the inspection substrate 200 of the assembly sheet 500 according to the second modified example. FIG. 13(a) is a top view of the inspection substrate 200. FIG. 13(b) shows a cross sectional view taken along the line I-I of FIG. 13(a).

As shown in FIGS. 13(a) and 13(b), in the inspection substrate 200 in the second modified example, one island-shape inner region 241 and another island-shape inner region 241 are formed in an annular opening 244 of the base insulating layer 240. In the one inner region 241, the one via 221 is formed. On the other hand, a plurality (three in this example) of vias 221A, 221B, 221C are formed in another inner region 241.

In the present example, the diameter of the plurality of vias 221A to 221C in another inner region 241 is smaller than the diameter of the via 221 in the one inner region 241. The vias 221, 221A to 221C have the configuration and measurement that respectively correspond to the multiple types of vias (not shown) formed at the suspension board 100. Thus, multiple types of vias of each suspension board 100 can be inspected using the one inspection substrate 200.

As shown in FIGS. 13(a) and 13(b), the plating layer 230 of FIGS. 8(a) to 8(c) does not have to be formed at the conductor layer 220. Further, the cover insulating layer 250 does not have to be formed in part or all of the vias 221, 221A to 221C. In the examples of FIGS. 13(a) and 13(b), the cover insulating layer 250 is not formed at the vias 221A to 221C.

(9) Effects

In the assembly sheet 500 according to the present embodiment, the inspection substrate 200 is formed to be integrally supported at the support frame 510 similarly to the plurality of suspension boards 100, and the vias 128, 129 of the plurality of suspension boards 100 and the via 221 of the inspection substrate 200 have the same configuration. Thus, states of the vias 128, 129 and a state of the via 221 have a high correlation. Therefore, inspection of the via 221 of the inspection substrate 200 is performed, whereby the inspection of the vias 128, 129 of the plurality of suspension boards 100 can be performed in a short period of time, and the reliability of the inspection results can be improved.

In the present example, the inspection of the via 221 of the inspection substrate 200 formed in each of the rectangular regions 521 to 525 of the assembly sheet 500 is performed, whereby reliability of the inspection results of the vias 128, 129 of the plurality of suspension boards 100 formed in the corresponding rectangular regions can be improved.

Further, in the assembly sheet 500 according to the present embodiment, the vias 128, 129 can be prevented by the cover insulating layer 180 from corroding, and the via 221 is prevented by the cover insulating layer 250 from corroding. Thus, a correlation over time between the state of the via 221 of the inspection substrate 200 and the states of the vias 128, 129 of the plurality of suspension boards 100 can be prevented from being reduced.

(10) Inventive Examples

The plurality of assembly sheets 500 having the configuration shown in FIG. 1 were fabricated as the inventive examples 1 to 12. The vias 221 of the inspection substrates 200 in the plurality of assembly sheets 500 have different diameters, respectively. Further, the via 221 of the inspection substrate 200 and the via 128 of each suspension board 100 have the same configuration and the same diameter in the same assembly sheet 500. The one inspection substrate 200 and the one suspension board 100 were selected from each of the assembly sheets 500 of the inventive examples 1 to 12, and the resistance value of the via 221 of the selected inspection substrate 200 and the resistance value of the via 128 of the selected suspension board 100 were measured.

Here, the resistance value of the via 221 of the inspection substrate 200 is the resistance value between the support substrate 210 and the plating layer 230 of FIGS. 8(*a*) to 8(*c*), and the resistance value of the via 128 of the suspension board 100 is the resistance value between the support substrate 110 and the connector 126 of FIGS. 7(*a*) and 7(*b*). The measurement results of the resistance value of the via 221 of the inspection substrate 200 and the resistance value of the via 128 of the suspension board 100 are shown in Table 1.

TABLE 1

|  | INSPECTION SUBSTRATE | SUSPENSION BOARD |
|---|---|---|
| INVENTIVE EXAMPLE 1 | 0.139 Ω | 0.180 Ω |
| INVENTIVE EXAMPLE 2 | 0.171 Ω | 0.197 Ω |
| INVENTIVE EXAMPLE 3 | 0.176 Ω | 0.203 Ω |
| INVENTIVE EXAMPLE 4 | 0.174 Ω | 0.192 Ω |
| INVENTIVE EXAMPLE 5 | 0.185 Ω | 0.187 Ω |
| INVENTIVE EXAMPLE 6 | 0.184 Ω | 0.235 Ω |
| INVENTIVE EXAMPLE 7 | 0.213 Ω | 0.187 Ω |
| INVENTIVE EXAMPLE 8 | 0.297 Ω | 0.286 Ω |
| INVENTIVE EXAMPLE 9 | 0.278 Ω | 0.273 Ω |
| INVENTIVE EXAMPLE 10 | 0.335 Ω | 0.303 Ω |
| INVENTIVE EXAMPLE 11 | 0.355 Ω | 0.355 Ω |
| INVENTIVE EXAMPLE 12 | 0.358 Ω | 0.339 Ω |

As shown in Table 1, the resistance value of the via 221 of the inspection substrate 200 selected from the assembly sheet 500 of the inventive example 1 was 0.139Ω, and the resistance value of the via 128 of the suspension board 100 was 0.180Ω. The resistance value of the via 221 of the inspection substrate 200 selected from the assembly sheet 500 of the inventive example 2 was 0.171Ω, and the resistance value of the via 128 of the suspension board 100 was 0.197Ω.

The resistance value of the via 221 of the inspection substrate 200 selected from the assembly sheet 500 of the inventive example 3 was 0.176Ω, and the resistance value of the via 128 of the suspension board 100 was 0.203Ω. The resistance value of the via 221 of the inspection substrate 200 selected from the assembly sheet 500 of the inventive example 4 was 0.174Ω, and the resistance value of the via 128 of the suspension board 100 was 0.192Ω.

The resistance value of the via 221 of the inspection substrate 200 selected from the assembly sheet 500 of the inventive example 5 was 0.185Ω, and the resistance value of the via 128 of the suspension board 100 was 0.187Ω. The resistance value of the via 221 of the inspection substrate 200 selected from the assembly sheet 500 of the inventive example 6 was 0.184Ω), and the resistance value of the via 128 of the suspension board 100 was 0.235Ω.

The resistance value of the via 221 of the inspection substrate 200 selected from the assembly sheet 500 of the inventive example 7 was 0.213Ω, and the resistance value of the via 128 of the suspension board 100 was 0.187Ω. The resistance value of the via 221 of the inspection substrate 200 selected from the assembly sheet 500 of the inventive example 8 was 0.297Ω, and the resistance value of the via 128 of the suspension board 100 was 0.286Ω.

The resistance value of the via 221 of the inspection substrate 200 selected from the assembly sheet 500 of the inventive example 9 was 0.278Ω, and the resistance value of the via 128 of the suspension board 100 was 0.273Ω. The resistance value of the via 221 of the inspection substrate 200 selected from the assembly sheet 500 of the inventive example 10 was 0.335Ω, and the resistance value of the via 128 of the suspension board 100 was 0.303Ω.

The resistance value of the via 221 of the inspection substrate 200 selected from the assembly sheet 500 of the inventive example 11 was 0.355Ω, and the resistance value of the via 128 of the suspension board 100 was 0.355Ω. The resistance value of the via 221 of the inspection substrate 200 selected from the assembly sheet 500 of the inventive example 12 was 0.358Ω, and the resistance value of the via 128 of the suspension board 100 was 0.339Ω.

FIG. 14 is a diagram showing the relationship between the resistance value of the via 221 of the inspection substrate 200 and the resistance value of the via 128 of the suspension board 100. The ordinate of FIG. 14 shows the resistance value of the via 221 of the inspection substrate 200, and the abscissa shows the resistance value of the via 128 of the suspension board 100.

As shown in FIG. 14, in the inventive examples 1 to 12, the resistance value of the via 221 of the inspection substrate 200 substantially linearly changes depending on the change in resistance value of the via 128 of the suspension board 100. Thus, it was confirmed that the resistance value of the via 221 of the inspection substrate 200 and the resistance value of the via 128 of the suspension board 100 have a high correlation.

Note that, it was confirmed that a correlation between the resistance value of the via 221 of the inspection substrate 200 fabricated outside of the product guarantee region 550 of FIG. 2 and the resistance value of the via 128 of the suspension board 100 was lower than a correlation between the resistance value of the via 221 of the inspection substrate 200 fabricated inside of the product guarantee region 550 and the resistance value of the via 128 of suspension board 100.

(11) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

The assembly sheet 500 is an example of a suspension board assembly sheet with circuits, the suspension board 100 is an example of a suspension board with circuits, the inspection substrate 200 is an example of a inspection substrate and the support frame 510 is an example of a support frame. The support substrates 110, 210 are respectively examples of first and second support substrates, the base insulating layers 170, 240 are respectively examples of first and second insulating layers, the write wiring traces 120, 130 are examples of a conductor line, and the conductor layer 220 is an example of a conductor layer. The cover insulating layers 180, 250 are respectively examples of third and fourth insulating layers, the vias 128, 129 are examples of a first via, the via 221 is an example of a second via, the opening 244 is an example of an opening, the support substrate 530 is an example of a support substrate and the base insulating layer 540 is an example of an insulating layer.

As each of constituent elements recited in the claims, various other elements having configurations or functions described in the claims can be also used.

INDUSTRIAL APPLICABILITY

The present invention can be effectively utilized for various types of printed circuit boards.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:
1. A suspension board assembly sheet with circuits comprising: a plurality of suspension boards with circuits; an inspection substrate; and a support frame that integrally supports the plurality of suspension boards with circuits and the inspection substrate, wherein each of the plurality of suspension boards with circuits includes a conductive first support substrate, a first insulating layer formed on the first support substrate, a conductor line formed on the first insulating layer and a first via that passes through the first insulating layer and electrically connects the first support substrate and the conductor line, and the inspection substrate includes a conductive second support substrate, a second insulating layer formed on the conductive second support substrate, a conductor layer formed on the second insulating layer, and a second via that passes through the second insulating layer and electrically connects the conductive second support substrate and the conductor layer, and the first via and the second via have the same configuration, wherein the second insulating layer has an opening that is formed such that part of the conductive second support substrate is exposed.

2. The suspension board assembly sheet with circuits according to claim 1, wherein the opening is formed such that a portion having a length of not less than 300 um of the second support substrate is exposed.

3. The suspension board assembly sheet with circuits according to claim 1, wherein
the plurality of suspension boards with circuits further includes a third insulating layer formed on the first insulating layer to cover at least part of the conductor line and the first via, and
the inspection substrate further includes a fourth insulating layer formed on the second insulating layer such that the fourth insulating layer covers the second via and at least part of the conductor layer is exposed.

4. The suspension board assembly sheet with circuits according to claim 3, wherein
the fourth insulating layer is formed such that a portion having a length of not less than 300 μm of the conductor layer is exposed.

5. The suspension board assembly sheet with circuits according to claim 1, wherein
the plurality of suspension boards with circuits and the inspection substrate are supported in alignment by the support frame.

6. The suspension board assembly sheet with circuits according to claim 5, wherein
the inspection substrate is arranged between the suspension board with circuits at an end of the plurality of suspension boards with circuits and a portion of the support frame.

7. The suspension board assembly sheet with circuits according to claim 5, wherein
the inspection substrate is arranged between the pair of adjacent suspension boards with circuits of the plurality of suspension boards with circuits.

* * * * *